(12) United States Patent
Liao et al.

(10) Patent No.: US 10,048,290 B2
(45) Date of Patent: Aug. 14, 2018

(54) PROBE CARD DEVICE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chih-Chieh Liao, Taipei (TW); Yu-Min Sun, New Taipei (TW); Chih-Feng Cheng, Taoyuan (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 127 days.

(21) Appl. No.: 15/208,595

(22) Filed: Jul. 12, 2016

(65) Prior Publication Data

US 2017/0269126 A1   Sep. 21, 2017

(30) Foreign Application Priority Data

Mar. 15, 2016 (CN) .......................... 2016 1 0145978

(51) Int. Cl.
*G01R 1/073* (2006.01)
*G01R 31/28* (2006.01)

(52) U.S. Cl.
CPC ..... *G01R 1/07371* (2013.01); *G01R 1/07357* (2013.01); *G01R 31/2889* (2013.01)

(58) Field of Classification Search
CPC ............ G01R 1/07371; G01R 1/07357; G01R 31/2889
USPC ......... 324/751.11, 756.01–757.05, 500, 425, 324/437, 754.01–756.03, 758.01, 690, 324/696, 715, 725, 600
See application file for complete search history.

(56) References Cited

U.S. PATENT DOCUMENTS

2007/0057683 A1*  3/2007  Abe .................... G01R 31/2891
                                                          324/750.16
2010/0326702 A1* 12/2010  Dang .................. H01L 21/6835
                                                          174/250
2013/0249590 A1*  9/2013  Whetsel ......... G01R 31/318505
                                                          324/762.01

* cited by examiner

*Primary Examiner* — Melissa Koval
*Assistant Examiner* — Trung Nguyen
(74) *Attorney, Agent, or Firm* — CKC & Partners Co., Ltd.

(57) ABSTRACT

A probe card device includes a testing circuitry board, a flexible probe needle, a first solder portion, a second solder portion and an interconnected holder electrically connected to the testing circuitry board and the flexible probe needle in which one end of the interconnected holder is coupled to the flexible probe needle with the first solder portion, and the other end of the interconnected holder is coupled to a conductive pad of the testing circuitry board with the second solder portion. A first desoldering melting point of the first solder portion is higher than a second desoldering melting point of the second solder portion.

15 Claims, 5 Drawing Sheets

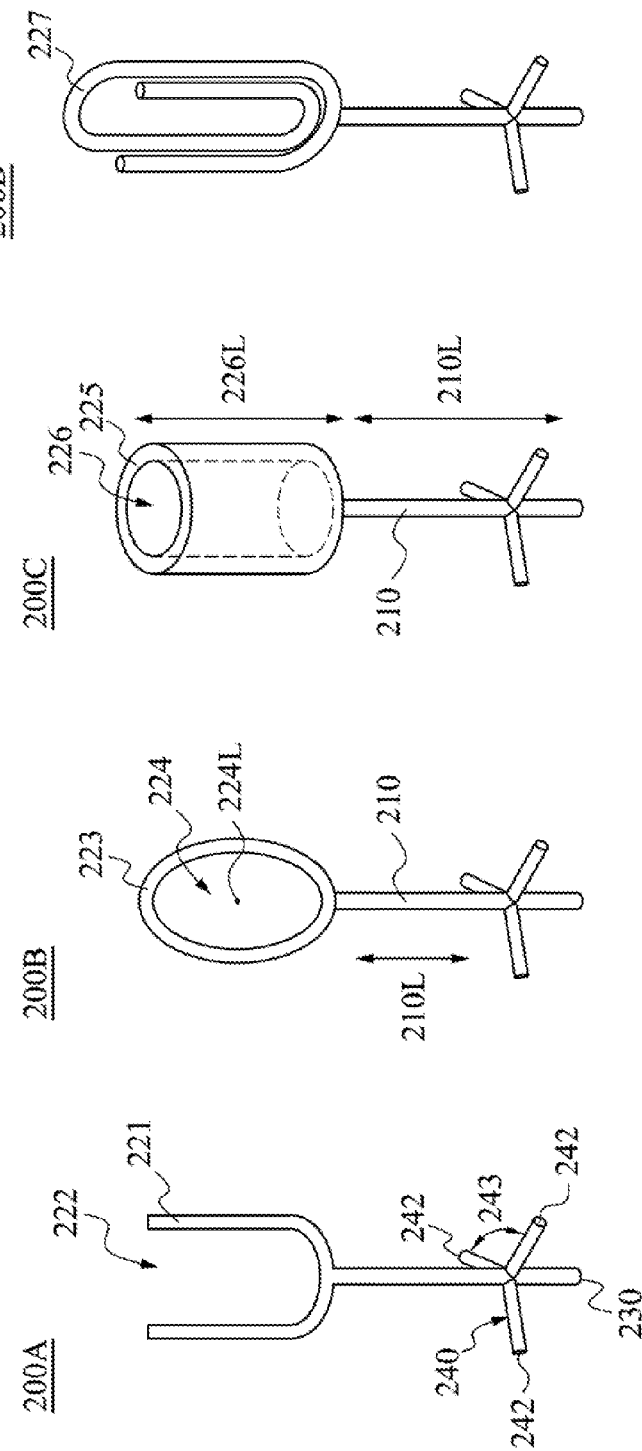

PROBE CARD DEVICE

RELATED APPLICATIONS

This application claims priority to China Application Serial Number 201610145978.6, filed Mar. 15, 2016, which is herein incorporated by reference.

BACKGROUND

Field of Disclosure

The present disclosure relates to a probe card device. More particularly, the present disclosure relates to a probe card device which is favorable to reinstallation of probe needles.

Description of Related Art

A conventional probe card includes a test circuitry board and a pin group having several probe needles. The pin group is coupled to the test circuitry board, and the probe needles of the pin group are used to contact with a device under test (DUT) so that the test circuitry board and the device under test (DUT) can access testing data in processing test procedures.

In order to substitute the pin group from the test circuitry board for reinstallation of the probe needles, a user typically has to desolder the probe needles from the test circuitry board so as to allow the probe needles to be smoothly removed from the test circuitry board.

However, because high temperature caused by the desoldering of the probe needles from the test circuitry board may cause unexpected damage to the conductive pads or internal circuitry of the test circuitry board or the probe needles of the pin group, and the probe needles may become unsuitable for reinstallation onto a test circuitry board.

Therefore, how to effectively overcome the aforementioned inconvenience and shortages is a serious concern for many industries.

SUMMARY

An aspect of the disclosure is to provide a probe card device to overcome the defects and inconvenience of the prior art.

According to one embodiment, a probe card device for testing a device under test (DUT) includes at least one flexible probe needle, a testing circuitry board, at least one first soldering portion, at least one second soldering portion and at least one interconnected holder. The testing circuitry board includes at least one conductive pad. The first soldering portion has a first desoldering melting point. The second soldering portion is different from the first soldering portion, and the second soldering portion has a second desoldering melting point which is higher than the first desoldering melting point. The interconnected holder is electrically connected to the flexible probe needle and the testing circuitry board n which one end of the interconnected holder is coupled to one end of the flexible probe needle with the first soldering portion, and the other end of the interconnected holder is coupled to the conductive pad with the second soldering portion.

Therefore, since the testing circuitry board and the flexible probe needle are not directly connected together, for example, the testing circuitry board and the flexible probe needle are indirectly connected through the interconnected holder therebetween, thus, when the flexible probe needle is desoldered from the test circuitry board, the possibilities of the conductive pads or internal circuitry of the test circuitry board being damaged by the flexible probe needle can be decreased. Also, as the purpose of reinstallation of the flexible probe needle on the test circuitry board, by controlling temperature difference with a desoldering tool, that is, remaining the desoldering temperature to be lower than the second desoldering melting point by the desoldering tool, in the embodiment, the flexible probe needle rather than the interconnected holder can only be removed from the test circuitry board smoothly, so as to further reduce the possibilities that the interior of the test circuitry board may become damaged due to excessively high temperatures.

According to one embodiment, a probe card device includes a testing circuitry board and a plurality of interconnected holders. The testing circuitry board includes a plurality of conductive pads arranged at intervals in which each of the conductive pads is provided with an inserted hole. One end of each of the interconnected holders is inserted in one of the inserted holes to be coupled to one of the conductive pads with a soldering portion having a desoldering melting point of 220° C.-280° C., and the other end of each of the interconnected holders is used for coupling to a flexible probe needle.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

FIG. 4A-FIG. 4D are exemplary views of interconnected holders according to several embodiments of the disclosure.

DESCRIPTION OF THE EMBODIMENTS

Figure 1:
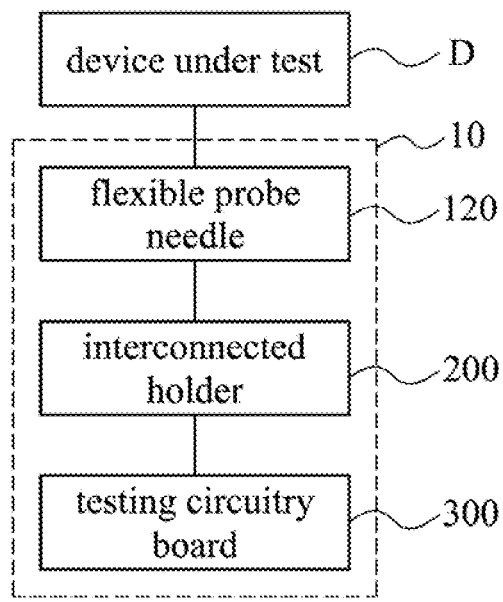
FIG. 1 is a schematic block view of a probe card device.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

Figure 2:
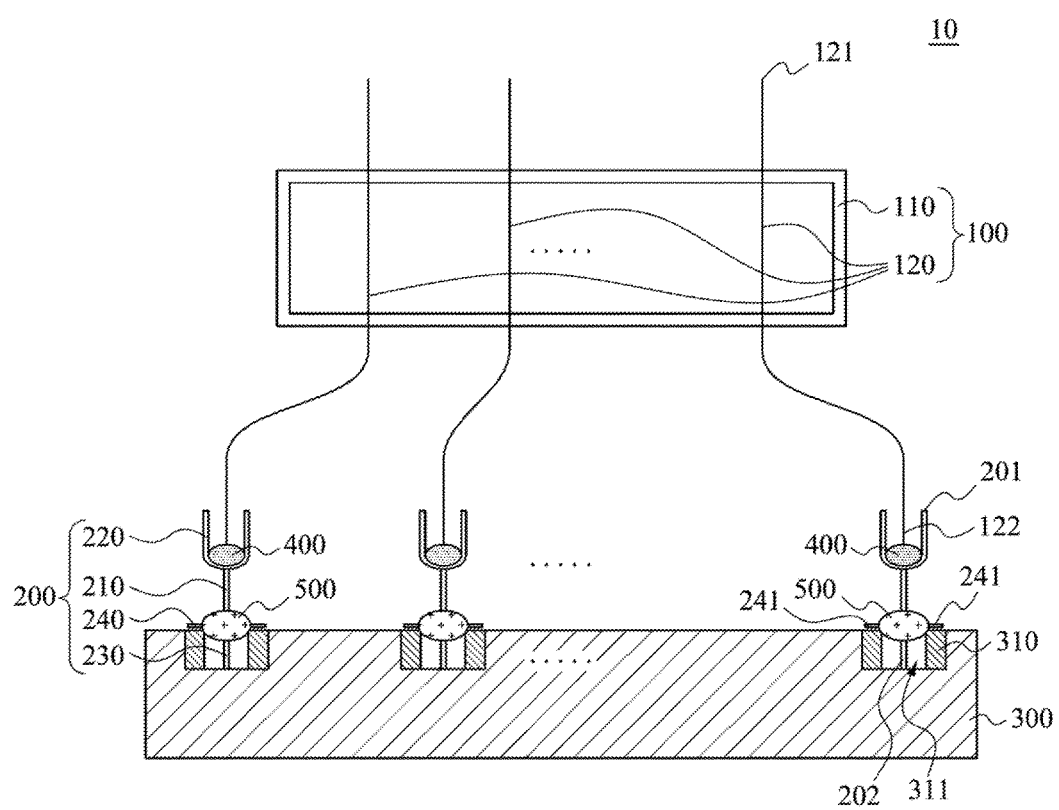
FIG. 2 is a side view of a probe card device according to one embodiment of the disclosure.

Reference is now made to FIG. 1 and FIG. 2, in which FIG. 1 is a schematic block view of a probe card device 10, and FIG. 2 is a side view of a probe card device 10 according to one embodiment of the disclosure. As shown in FIG. 1 and FIG. 2, in the embodiment, the probe card device 10 for testing a device under test D (DUT) includes a probe needle set 100, a testing circuitry board 300, a plurality of interconnected holders 200, first soldering portions 400 (e.g., soldering balls or soldering bars), and second soldering portions 500 (e.g., soldering balls or soldering bars). The testing circuitry board 300 includes a plurality of conductive pads 310. The conductive pads 310 are arranged at intervals on one surface of the testing circuitry board 300, and each of the conductive pads 310 is formed with an inserted hole 311 thereon. The probe needle set 100 includes a loading substrate 110 and a plurality of flexible probe needles 120. The loading substrate 110 is separably connected to the testing circuitry board 300. For example, the loading substrate 110 is directly or indirectly jointed (e.g., soldered) to the testing circuitry board 300 with mechanisms (Not shown in figures). The flexible probe needles 120 are fixedly connected to the loading substrate 110.

In the embodiment, one end 121 of each of the flexible probe needles 120 which is opposite to the testing circuitry board 300 extends outwards from one surface of the loading substrate 110 being opposite to the testing circuitry board 300, and the end 121 of each of the flexible probe needles 120 is used for directly contacting with each pad or contact (Not shown in figures) of the device under test D, however, the disclosure is not limited thereto. The interconnected holders 200 are located between the probe needle set 100 and the testing circuitry board 300, and each of the interconnected holders 200 is electrically connected to the flexible probe needles 120 and the testing circuitry board 300 so that the testing circuitry board 300 can access testing data with the device under test D (FIG. 1) through the interconnected holders 200 and the flexible probe needles 120.

Specifically, in these interconnected holders 200, each of the interconnected holders 200 is provided with a first end 201 and a second end 202 which is opposite to the first end 201. The first end 201 of the interconnected holder 200 is coupled (e.g., soldered) to one end of the flexible probe needle 120 with one of the first soldering portions 400, and the second end 202 of the interconnected holder 200 is coupled (e.g., soldered) to one of the conductive pads 310 with one of the second soldering portions 500.

It is noted, the first soldering portion 400 has a first desoldering melting point. When the first soldering portion 400 is heated to increase the temperature thereof to the first desoldering melting point, the first soldering portion 400 can be melted, and the interconnected holder 200 can be then removed from the flexible probe needle 120. For example, the first desoldering melting point of the first soldering portion 400 is in a range of 130° C.-200° C., more specifically, the first desoldering melting point of the first soldering portion 400 is 140° C. The second soldering portion 500 is different from the first soldering portion 400, and the second soldering portion 500 has a second desoldering melting point which is higher than the first desoldering melting point. When the second soldering portion 500 is heated to increase the temperature thereof to the second desoldering melting point, the second soldering portion 500 can be melted, and the interconnected holder 200 can be then removed from the soldered conductive pad 310 of the testing circuitry board 300. For example, the second desoldering melting point of the second soldering portion 500 is in a range of 220° C.-280° C., more specifically, the second desoldering melting point of the second soldering portion 500 is 240° C. However, as long as the second desoldering melting point of the second soldering portion is different and higher than the first desoldering melting point of the first soldering portion, the disclosure is not limited to whether the first soldering portion and the second soldering portion are made with different material, formulations or additives.

Therefore, when the probe needle set 100 is substituted or detached from the testing circuitry board 300 for reinstallation of the flexible probe needles 120, an user can heat the first soldering portion 400 with a desoldering tool to adjust the temperature of the first soldering portion 400 between the first desoldering melting point and the second desoldering melting point. Thus, the user can separately disconnect the flexible probe needles 120 and the interconnected holder 200, rather than to disconnect the interconnected holder 200 and the testing circuitry board 300, so that the flexible probe needles 120 can be smoothly separated from the testing circuitry board 300 without damaging the interior of the test circuitry board 300. Furthermore, since the testing circuitry board'300 and the flexible probe needles 120 are indirectly connected together, not directly connected together with soldering material, thus, the possibilities of the conductive pads 310 or internal circuitry of the test circuitry board 300 being damaged by the flexible probe needles 120 can be decreased.

More specifically, as shown in FIG. 2, each of the interconnected holders 200 includes a bracket body 210, a first connecting portion 220 and a second connecting portion 230. The first connecting portion 220 is disposed on one end of the bracket body 210, and fixedly coupled to one end 122 of one of the flexible probe needles 120 opposite to the end 121 thereof. The end 122 of one of the flexible probe needles 120 is coupled to the first connecting portion 220 with the first soldering portion 400. The second connecting portion 230 is disposed on another end of the bracket body 210, and the second connecting portion 230 inserts in one of the inserted holes 311. Each of the interconnected holders 200 is coupled to one of the conductive pads 310 with the second soldering portion 500. In the embodiment, each of the interconnected holders 200 is further provided with a position-limited portion 240. The position-limited portion 240 is disposed on the bracket body 210, and is arranged between the first connecting portion 220 and the second connecting portion 230 for positioning the interconnected holder 200 on the conductive pad 310. In the embodiment, the position-limited portion 240, for example, includes two first ribs 241. The first ribs 241 are coplanar, and are laterally and oppositely extended.

When the second connecting portion 230 of the interconnected holder 200 inserts into the corresponding inserted hole 311, the first ribs 241 exactly abut on the same conductive pad 310 for hanging the interconnected holder 200 on the conductive pad 310 (i.e., inserted hole 311), so that the interconnected holder 200 will not continuously fall into the inserted hole 311.

Furthermore, the larger attachment areas provided by the first ribs 241 also can be advantageous for the second soldering portions 500 to firmly connect the interconnected holder and the corresponding conductive pad 310 (i.e., inserted hole 311). However, the disclosure is not limited thereto, among other embodiments, the interconnected holder not needed to have these first ribs.

Figure 3:
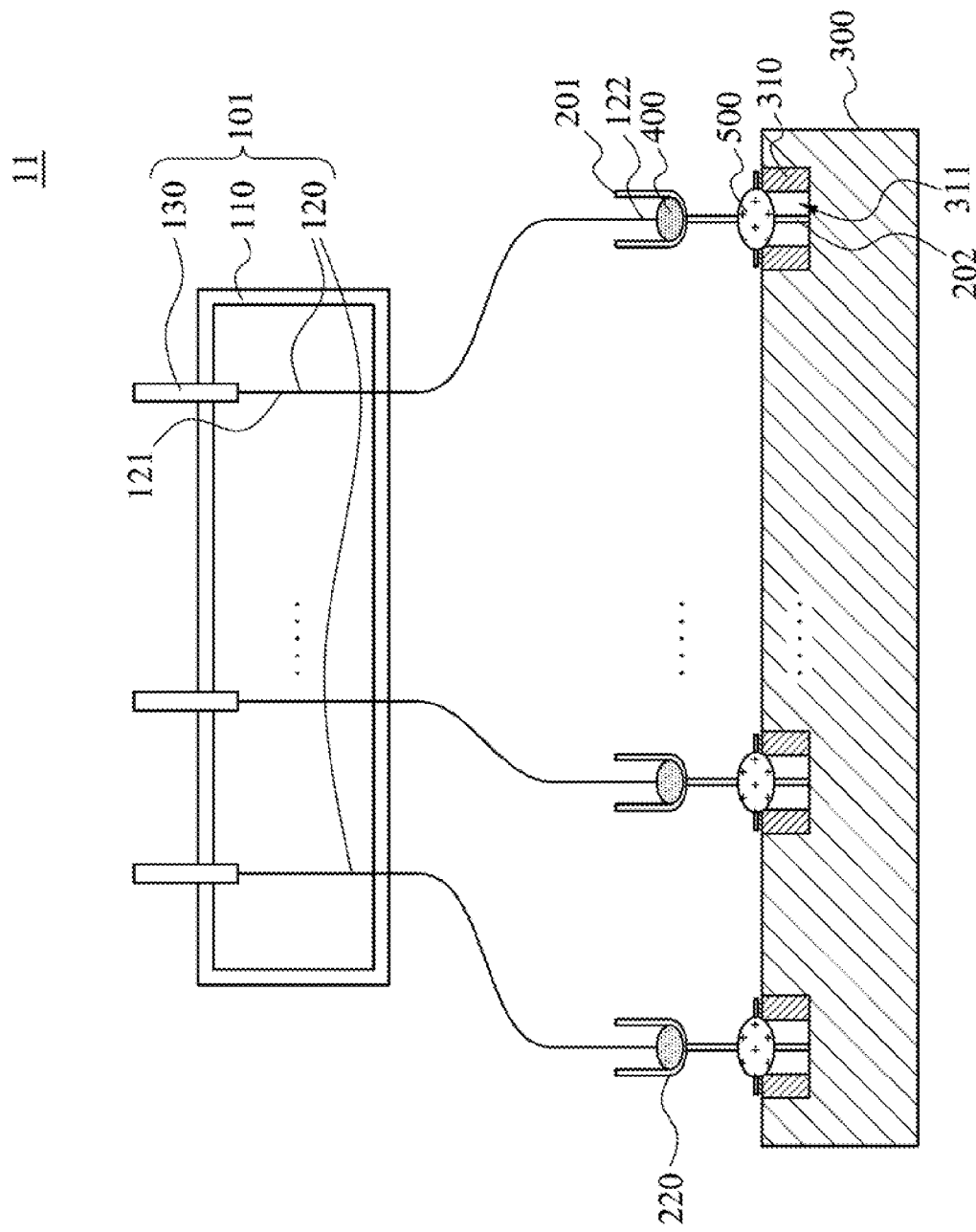
FIG. 3 is a side view of a probe card device according to another embodiment of the disclosure.

FIG. 3 is a side view of a probe card device 11 according to another embodiment of the disclosure. The probe card device 11 of the embodiment is substantially the same as the probe card device 10 of the aforementioned embodiment, as shown in FIG. 3, except that the probe set 101 in this embodiment further includes a plurality of pin contacts 130. Each of the pin contacts 130 is inserted onto one surface of the loading substrate 110 being opposite to the testing circuitry board 300, and electrically connected to the end 121 of each of the flexible probe needles 120 opposite to the testing circuitry board 300. For example, each of the pin contacts 130 is a pogo-pin connector in which one end of the pogo-pin connector is electrically connected to the flexible probe needle 120 in the loading substrate 110, and the pogo-pin connector is retractably disposed on the loading substrate 110 for absorbing the pressing force transmitted back from the device under test D when the pogo-pin connector directly pushes the device under test D. Thus, through the electrical connection of the pin contacts 130 and the device under test D, the testing circuitry board 300 accesses testing data with the device under test D (FIG. 1).

FIG. 4A-FIG. 4O are exemplary views of interconnected holders 200A-200O according to several embodiments of the disclosure. Each of the interconnected holders 200A-200D of these embodiments is substantially the same as one of the interconnected holders 200 of the aforementioned embodiment, except that, in one example, refer to FIG. 4A and FIG. 2, the interconnected holder 200A is provided with a U-shaped connecting portion 221. The U-shaped connecting portion 221 is formed with a U-shaped indentation 222 thereon for receiving the end 122 of one of the flexible probe needles 120 (FIG. 2). Since the U-shaped connecting portion 221 provides larger attachment areas, the first soldering portion 400 is advantageous to firmly connect the end 122 of one of the flexible probe needles 120 and the U-shaped connecting portion 221.

In another example, refer to FIG. 4B and FIG. 2, the interconnected holder 200B is provided with a ring-shaped connecting portion 223. The ring-shaped connecting portion 223 is formed with an enclosed opening 224 in which an axis direction 224L of the enclosed opening 224 is orthogonal to a longitudinal direction 210L of the bracket body 210. The enclosed opening 224 is used to receive the end 122 of one of the flexible probe needles 120 (FIG. 2). Since the enclosed opening 224 may reduce the possibility of the end 122 of the flexible probe needle 120 easily removed from the ring-shaped connecting portion 223, the first soldering portion 400 is advantageous to firmly connect the end 122 of one of the flexible probe needles 120 and the ring-shaped connecting portion 223.

In still another example, refer to FIG. 4C and FIG. 2, the interconnected holder 200C is provided with a cylindrical connecting portion 225. The cylindrical connecting portion 225 is formed with a recess 226 in which a longitudinal direction 226L of the recess 226 is coaxial with a longitudinal direction 210L of the bracket body 210. The recess 226 is used to receive the end 122 of one of the flexible probe needles 120 (FIG. 2). Since the bottom of the recess 226 may avoid the liquefied first soldering portion from leaking out of the cylindrical connecting portion 225, the first soldering portion is advantageous to be firmly connected to the end 122 of one of the flexible probe needles 120 and the cylindrical connecting portion 225.

In still another example, refer to FIG. 4D and FIG. 2, the interconnected holder 200D is provided with a paperclip-style connecting portion 227. The end 122 of one of the flexible probe needles 120 can be clipped on the paperclip-style connecting portion 227 before the first soldering portion couples the flexible probe needle 120 and the paperclip-style connecting portion 227. However, the disclosure is not limited thereto, in other embodiment, the first connection portion does not have to those connecting portion 221, 223, 225, 227.

In still another example, refer to FIG. 4A, the position-limited portion 240 further includes three second ribs 242 laterally extending respectively. The second ribs 242 are coplanar, and an included angle 243 of 120 degrees can be defined between any two neighboring ones of the second ribs 242. Thus, refer to FIG. 2, when the second connecting portion 230 of the interconnected holder 200 inserts into the inserted hole 311, as the position-limited portion 240 includes the second ribs 242, the second ribs 242 are evenly distributed on a periphery portion of the same conductive pad 310 surrounding the inserted hole for hanging the interconnected holder 200 on the conductive pad 310 (i.e., inserted hole 311) so that the interconnected holder 200 will not continuously fall in the inserted hole 311. Thus, the second soldering portion 500 is able to couple the testing circuitry board 300 with the interconnected holder being positioned on the conductive pad 310. Furthermore, the larger attachment areas collectively provided by the second ribs 242 also can be advantageous for the second soldering portions 500 to firmly connect the interconnected holder and the corresponding conductive pad 310 (i.e., inserted hole 311). However, the disclosure s not limited thereto, among other embodiments, the interconnected holder is not needed to have these second ribs.

Figure 5B:
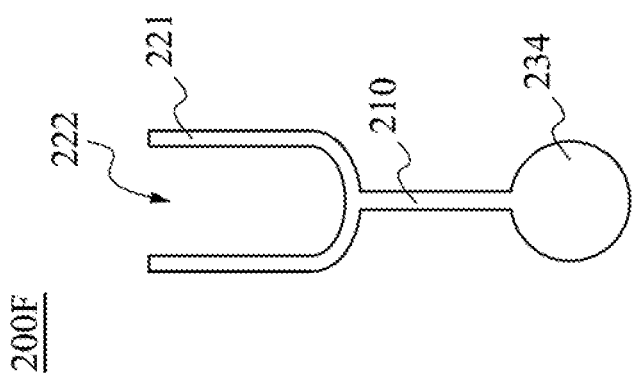
FIG. 5A-FIG. 5B are exemplary views of interconnected holders according to several embodiments of the disclosure.
Figure 5A:
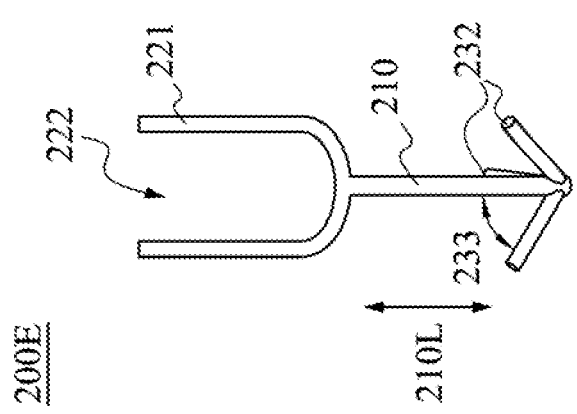

FIG. 5A-FIG. 5B are exemplary views of interconnected holders 200E-200F according to several embodiments of the disclosure. As shown in FIG. 5A, each of the interconnected holders 200E-200F of these embodiments is substantially the same as one of the interconnected holders 200 of the aforementioned embodiment, except that, refer to FIG. 5A, the interconnected holder 200E having no such the aforementioned position-limited portion 240 is positioned on the conductive pad 310 with the second connection portion 230 only. In one example, the interconnected holder 230 is provided with a barb portion 231. The barb portion 231 is formed with a plurality of inclined ribs 232. The inclined ribs 232 surround and connect the bracket body 210, and an included angle 233 as an acute angle is defined between each of the inclined ribs 232 and the bracket body 210. Therefore, when the barb portion 231 is pushed into the inserted hole 311, the inclined ribs 232 exactly abut the inner walls of the inserted hole 311 in the inserted hole 311 so that the interconnected holder 200 is not easily removed outwards from the inserted hole 311 so as to further be positioned on the conductive pad 310, not continuously falling in the inserted hole 311. Thus, the second soldering portion 500 is able to couple the testing circuitry board 300 with the interconnected holder being positioned on the conductive pad 310.

In another example, as shown in FIG. 5B, the interconnected holder 230 is provided with an elastic pressing-fit portion 234. The cross-sectional area of the elastic pressing-fit portion 234 is slightly larger than the area of the inserted hole 311. Therefore, when the elastic pressing-fit portion 234 is pushed into the inserted hole 311, the elastic pressing-fit portion 234 exactly abuts the inner walls of the inserted hole 311 in the inserted hole 311 so that the interconnected holder 200 is not easily removed outwards from the inserted hole 311 so as to further be positioned on the conductive pad 310, not continuously falling in the inserted hole 311. Thus, the second soldering portion 500 is able to be coupled to the testing circuitry board 300 with the interconnected holder being positioned on the conductive pad 310. However, the disclosure is not limited thereto, among other embodiments, the position-limited portion 240 does not have to be these kinds of the second connection portions 231, 234.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A probe card device for testing a device under test (DUT), comprising:
   at least one flexible probe needle;
   a testing circuitry board comprising at least one conductive pad thereon;
   at least one first soldering portion having a first desoldering melting point;
   at least one second soldering portion being different from the first soldering portion, and having a second desoldering melting point higher than the first desoldering melting point; and
   at least one interconnected holder electrically connected to the flexible probe needle and the testing circuitry board, the interconnected holder comprising a bracket body, a first connecting portion and a second connecting portion, the first connecting portion and the second connecting portion are respectively disposed on two opposite ends of the bracket body,
   wherein the first connecting portion is coupled to one end of the flexible probe needle with the first soldering portion, and the second connecting portion is coupled to the conductive pad with the second soldering portion.

2. The probe card device of claim 1, further comprising:
   a probe needle set comprising a loading substrate and the at least one flexible probe needle fixedly connected to the loading substrate,
   wherein the loading substrate is separably connected to the testing circuitry board.

3. The probe card device of claim 2, wherein the other end of the flexible probe needle extends outwards from one surface of the loading substrate being opposite to the testing circuitry board, and the other end of the flexible probe needle is used for directly contacting with the device under test (DUT).

4. The probe card device of claim 2, wherein the probe set further comprises at least one pin contact, the at least one pin contact is inserted onto one surface of the loading substrate being opposite to the testing circuitry board, and electrically connected to the other end of the flexible probe needle, wherein the pin contact is used for directly contacting with the device under test (DUT).

5. The probe card device of claim 1, wherein the at least one conductive pad is formed with an inserted hole; the first connecting portion is fixedly coupled to the one end of the flexible probe needle, and the second connecting portion inserts into the inserted hole.

6. The probe card device of claim 5, wherein the interconnected holder is further provided with a position-limited portion for positioning the interconnected holder on the at least one conductive pad, wherein the position-limited portion is disposed on the bracket body between the first connecting portion and the second connecting portion.

7. The probe card device of claim 1, wherein the first connecting portion is provided with a U-shaped connecting portion, a ring-shaped connecting portion, a cylindrical connecting portion or a paperclip-style connecting portion.

8. The probe card device of claim 1, wherein the interconnected holder is provided with two ribs laterally extending respectively, and the ribs abut on the at least one conductive pad for positioning the interconnected holder on the at least one conductive pad.

9. The probe card device of claim 1, wherein the second connecting portion is provided with a barb portion or an elastic pressing-fit portion for being fixedly received in an inserted hole of the at least one conductive pad.

10. The probe card device of claim 1, wherein the first desoldering melting point of the at least one first soldering portion is in a range of 130° C.-200° C.

11. A probe card device, comprising:
    a testing circuitry board comprising a plurality of conductive pads arranged at intervals, wherein each of the conductive pads is provided with an inserted hole; and
    a plurality of interconnected holders, each of the interconnected holders comprising a bracket body, a first connecting portion disposed on one end of the bracket body, and a second connecting portion disposed on another end of the bracket body for inserting in one of the inserted holes, in which the second connecting portion inserts in one of the inserted holes to be coupled to one of the conductive pads with a soldering portion having a desoldering melting point of 220° C.-280° C., and the first connecting portion is used for coupling to a flexible probe needle.

12. The probe card device of claim 11, wherein each of the interconnected holders is further provided with a position-limited portion for positioning the interconnected holder on one of the conductive pads,
    wherein the position-limited portion is disposed on the bracket body between the first connecting portion and the second connecting portion.

13. The probe card device of claim 11, wherein the first connecting portion of each of the interconnected holders is provided with a U-shaped connecting portion, a ring-shaped connecting portion, a cylindrical connecting portion or a paperclip-style connecting portion.

14. The probe card device of claim 11, wherein each of the interconnected holders is provided with two ribs laterally extending respectively, the ribs abut on one of the conductive pads to position the interconnected holder on the one of the conductive pads.

15. The probe card device of claim 11, wherein the end of each of the interconnected holders is provided with a barb portion or an elastic pressing-fit portion, and the barb portion or the elastic pressing-fit portion is used for being fixedly received in the inserted hole of the one of the conductive pads.

* * * * *